(12) United States Patent
Kowkutla et al.

(10) Patent No.: US 10,256,821 B2
(45) Date of Patent: Apr. 9, 2019

(54) DUAL FUNCTION ANALOG OR DIGITAL INPUT/OUTPUT BUFFER

(71) Applicant: TEXAS INSTRUMENTS INCORPORATED, Dallas, TX (US)

(72) Inventors: Venkateswar Reddy Kowkutla, Allen, TX (US); Erkan Bilhan, Dallas, TX (US); Venkateswara Reddy Pothireddy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/437,593

(22) Filed: Feb. 21, 2017

(65) Prior Publication Data

US 2018/0241378 A1  Aug. 23, 2018

(51) Int. Cl.
*H03K 19/017* (2006.01)
*H03K 19/0175* (2006.01)
*H03K 3/037* (2006.01)

(52) U.S. Cl.
CPC ..... *H03K 19/017509* (2013.01); *H03K 3/037* (2013.01)

(58) Field of Classification Search
CPC .................................................... H03K 3/037
See application file for complete search history.

(56) References Cited

U.S. PATENT DOCUMENTS

| | | | | |
|---|---|---|---|---|
| 6,509,758 B2 * | 1/2003 | Piasecki | ................... | G06J 1/00 326/37 |
| 6,981,090 B1 * | 12/2005 | Kutz | ................... | G06F 13/4022 257/666 |
| 7,046,035 B2 * | 5/2006 | Piasecki | ................ | G06F 13/4072 326/32 |
| 7,436,207 B2 * | 10/2008 | Rogers | ................ | G06F 13/4022 326/37 |
| 8,004,887 B2 * | 8/2011 | Roohparvar | ........... | G11C 5/066 365/185.03 |
| 8,441,298 B1 * | 5/2013 | Williams | ........... | H03K 19/1732 326/41 |
| 9,438,241 B1 * | 9/2016 | Davidovic | ..... | H03K 19/018571 |
| 9,612,987 B2 * | 4/2017 | Sullam | ................ | G06F 13/4022 |
| 2017/0093388 A1 * | 3/2017 | Yang | .................. | H03K 19/0185 |

* cited by examiner

*Primary Examiner* — Jeffery S Zweizig
(74) *Attorney, Agent, or Firm* — Michelle F. Murray; Charles A. Brill; Frank D. Cimino

(57) ABSTRACT

A method and circuitry that enables an input/output pin (I/O) on a System on a Chip to function either as an analog or as a digital input/output without compromising the overall performance of the system, thus giving the automated test equipment full flexibility to maximize parallel testing for both analog and digital modules.

17 Claims, 2 Drawing Sheets

DUAL FUNCTION ANALOG OR DIGITAL INPUT/OUTPUT BUFFER

TECHNICAL FIELD OF THE INVENTION

The technical field of this invention is dual function input/output buffers.

BACKGROUND OF THE INVENTION

Today's Systems on a Chip (SoC) have very high level of analog integration with multiple voltage regulators, voltage monitors, analog to digital and digital to analog converters, power on reset controllers and other systems which significantly increase the scope and complexity of manufacturing test coverage as well as the cost of testing. In order to reduce the SoC test time without compromising the test coverage and quality, a large number of analog test pins are required to enable the parallel testing of a number of analog modules. The analog test pins are normally dedicated pins that not only increase the package cost, but also reduce the number of available digital test pins due to limited number of channels provided by the Automated Test Equipment (ATE). This, in turn leads to increased test time for the digital logic as well.

SUMMARY OF THE INVENTION

A method and circuitry is shown that enables an input/output pin (I/O) to function either as an analog or as a digital input/output without compromising the overall performance of the I/O, thus giving the automated test equipment full flexibility to maximize parallel testing for both analog and digital modules.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
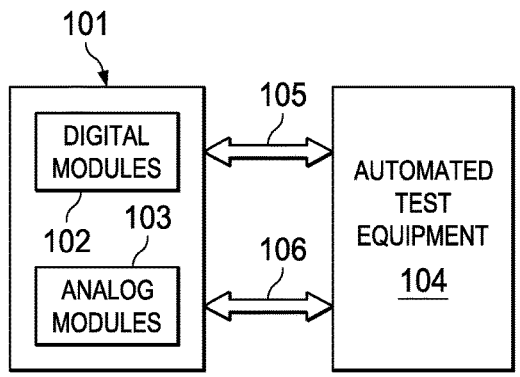
FIG. 1 shows the prior art implementation with separate digital and analog input/output connections between the System on a Chip under test and the Automated Test Equipment.

A prior art implementation is shown on FIG. 1. System on a Chip 101 containing a plurality of functional modules such as digital module 102 and analog module 103 is connected to automated test equipment 104. Connection is made by separate digital input/output connections 105 and analog input/output connections 106.

Figure 2:
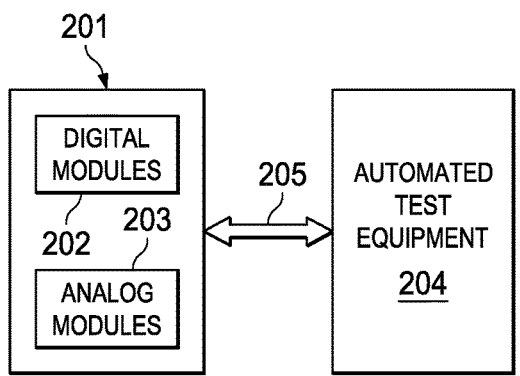
FIG. 2 shows the System on a Chip under test and the Automated Test Equipment connected by dual use analog and digital test connections.

FIG. 2 illustrates the method described herein. System on a chip 201 containing digital modules 202 and analog modules 203 is connected to automated test equipment 204 by dual function connections 205. Since these interconnections are operable to function either as digital or analog connections, the automated test equipment is able to optimize the testing function by dynamically allocating analog or digital connections as required for the test process.

Figure 3:
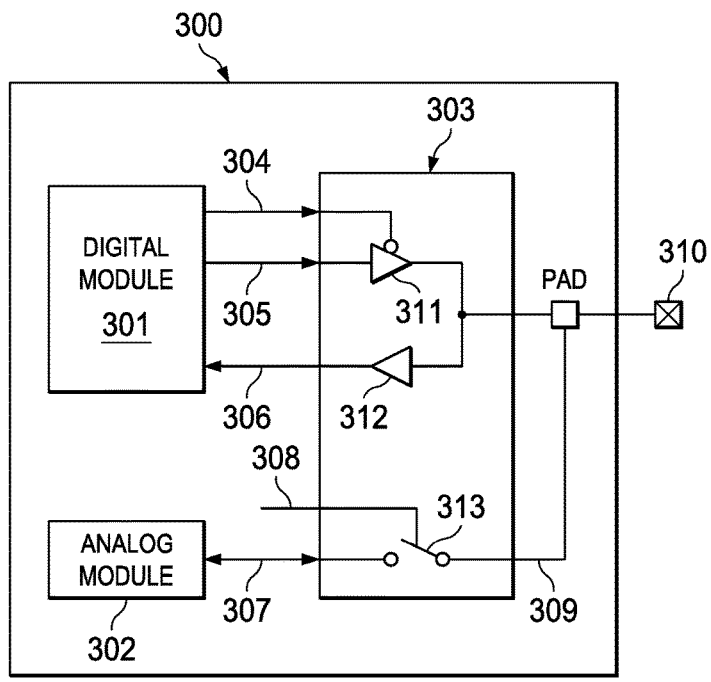
FIG. 3 shows an implementation of a dual analog/digital input/output buffer.

FIG. 3 describes an implementation of the dual function analog or digital input/output buffer implemented on the System on a Chip 300. Digital module 301 communicates to the dual function input/output buffer 303 through output connection 305 and input connection 306, with control connection 304 operable to switch the dual function buffer 303 between digital input or output by placing the output buffer 311 in high impedance state during input to buffer 312. The dual function buffer 303 connected to SoC package pin 310.

Analog module 302 communicates with the dual function buffer 303 through bidirectional connection 307. Isolation analog switch 313, controlled by analog/digital function selection line 308 is operable to isolate the analog module 302 from the package I/O pin 310 when the switch is open, or to connect said analog module 302 via connection 309 to I/O pin 310 when the analog isolation switch 313 is closed, and output buffer 311 is in the high impedance state.

Figure 4:
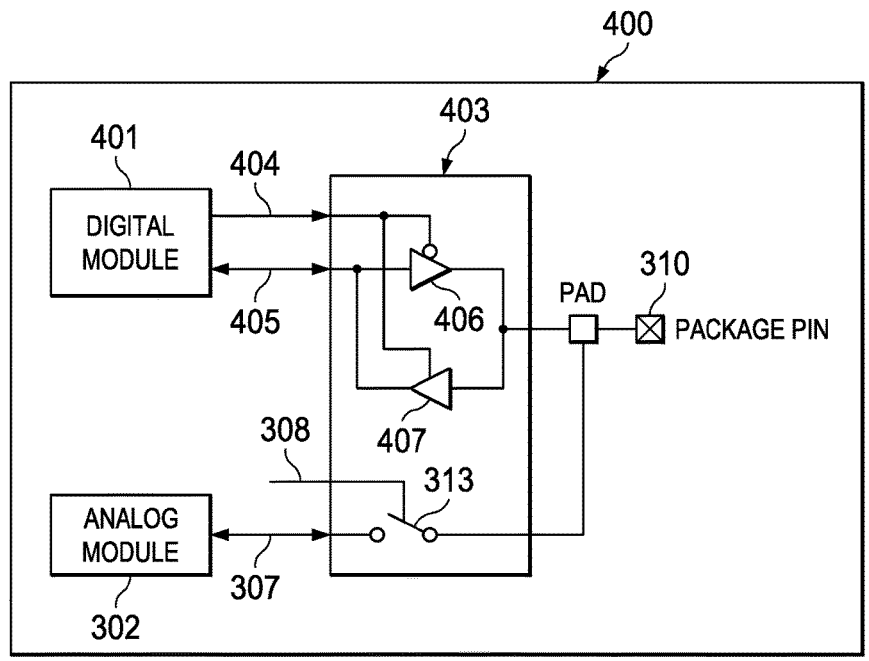
FIG. 4 shows an alternate implementation of a dual analog/digital input/output buffer.

FIG. 4 shows an alternate implementation of the dual function analog or digital input/output buffer implemented on the System on a Chip 400 that reduces the number of connections between the digital module and the digital input/output buffer. Digital module 401 communicates to the dual function input/output buffer 403 through bidirectional input/output connection 405 and input/output direction control connection 404. Direction control connection 404 will place buffer 406 in a high impedance state and enables buffer 407 when the input function is selected, and places buffer 407 in a high impedance state with buffer 406 enabled during output.

Figure 5:
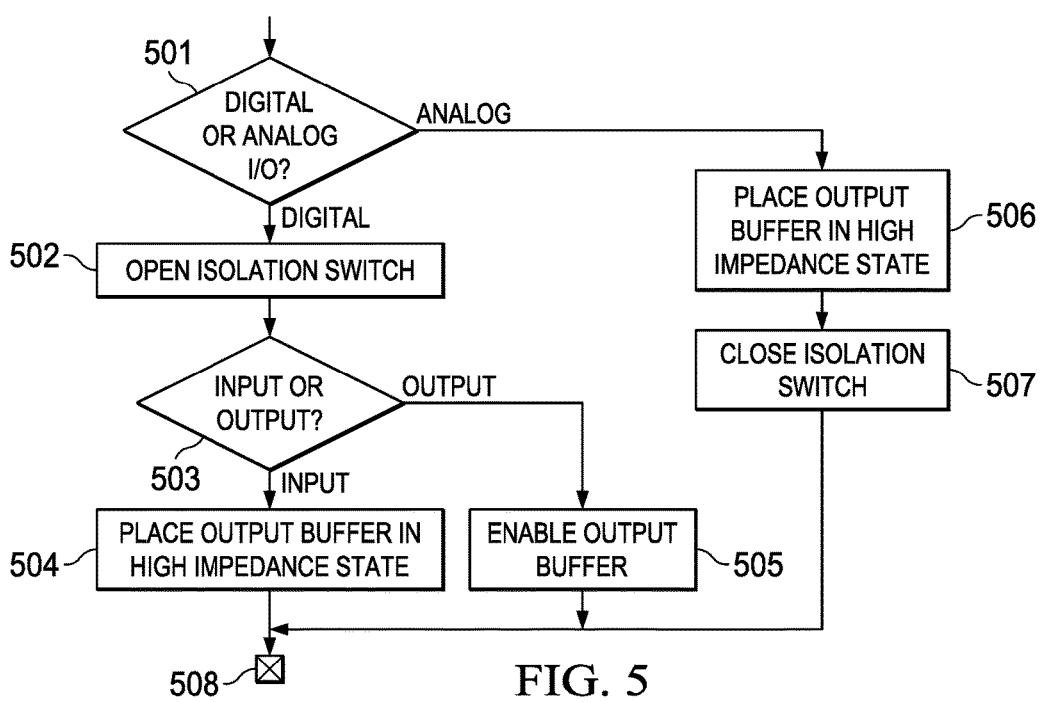
FIG. 5 shows a flowchart of the operating modes.

FIG. 5 shows a flowchart of the operation of the dual function input/output buffer. The analog or digital operation mode is selected in 501. In digital mode, the analog isolation switch 313 is opened in 502, then input or output mode is selected in 503. In input mode, the output buffer 311 is placed in the high impedance state in 504. In output mode, output buffer 311 is enabled in 505. The outputs from 504 and 505 are connected to SoC package pin 508.

If analog mode is selected in 501, output buffer 311 is placed in the high impedance state in 506, then isolation switch 313 is closed in 507 thus connecting the analog modules to I/O pin 508.

The described implementation in addition to optimizing the SoC test sequence also optimizes the overall area of the dual function I/O buffer 303 by sharing the Electro Static Discharge (ESD) protection of digital input/output and analog feedthrough input/output functions and by utilizing unused areas inside the digital input/output functions for the analog switch integration.

What is claimed is:

1. A System on a Chip (SoC), comprising:
    an analog module;
    a digital module;
    a package pin; and
    an analog/digital input/output buffer coupled between the analog module and the package pin, and between the digital module and the package pin, the analog/digital input/output buffer comprising:
        an isolation analog switch coupled between the analog module and the package pin, the isolation analog switch configured to:
            couple the analog module to the package pin, to test the analog module, while the analog/digital input/output buffer is in an analog mode; and isolate the analog module from the package pin, while the analog/digital input/output buffer is in a digital mode; and a digital buffer circuit coupled between the digital module and the package pin, the digital buffer circuit configured to couple the digital module to the package pin, to test the digital module, while the analog/digital input/output buffer is in the digital mode.

2. The SoC of claim 1, wherein the digital buffer circuit comprises:
   a digital output buffer coupled between an output of the digital module and the package pin; and
   a digital input buffer coupled between an input of the digital module and the package pin.

3. The SoC of claim 2, wherein the digital output buffer is configured to:
   enable, in response to determining that a control signal indicates that a digital output mode is selected; and
   enter a high impedance state, in response to determining that the control signal indicates that either a digital input mode is selected or that the analog/digital input/output buffer is in the analog mode.

4. The SoC of claim 1, wherein the digital buffer circuit comprises:
   a digital output buffer coupled between a bidirectional input/output connection of the digital module and the package pin; and
   a digital input buffer coupled in parallel with the digital output buffer.

5. The SoC of claim 1, wherein the package pin is configured to be coupled to automated test equipment.

6. The SoC of claim 1, wherein the isolation analog switch is further configured to:
   close, in response to a first indication of a function selection line; and
   open, in response to a second indication of the function selection line.

7. The SoC of claim 1, wherein the SoC utilizes areas inside an area of the digital buffer circuit for analog switch integration.

8. An analog/digital input/output buffer, comprising:
   an isolation analog switch coupled between an analog module and a package pin, the isolation analog switch configured to:
      couple the analog module to the package pin, to test the analog module, while the analog/digital input/output buffer is in an analog mode; and
      isolate the analog module from the package pin, while the analog/digital input/output buffer is in a digital mode;
   a digital output buffer coupled between a digital module and the package pin, the digital output buffer configured to couple the digital module to the package pin, to test the digital module, while the analog/digital input/output buffer is in a digital output mode; and
   a digital input buffer coupled between the digital module and the package pin, the digital input buffer configured to couple the digital module to the package pin, to test the digital module, while the analog/digital input/output buffer is in a digital input mode.

9. The analog/digital input/output buffer of claim 8, wherein the digital output buffer is coupled between an output of the digital module and the package pin, and wherein the digital input buffer coupled between an input of the digital module and the package pin.

10. The analog/digital input/output buffer of claim 9, wherein the digital output buffer is configured to:
    enable, in response to determining that a control signal indicates that the digital output mode is selected; and
    enter a high impedance state, in response to determining that the control signal indicates that either the digital input mode is selected or that the analog/digital input/output buffer is in the analog mode.

11. The analog/digital input/output buffer of claim 8, wherein the digital output buffer is coupled between a bidirectional input/output connection of the digital module and the package pin, and wherein the digital input buffer coupled in parallel with the digital output buffer.

12. The analog/digital input/output buffer of claim 8, wherein the package pin is configured to be coupled to automated test equipment.

13. The analog/digital input/output buffer of claim 8, wherein the isolation analog switch is further configured to:
    close, in response to a first indication of a function selection line; and
    open, in response to a second indication of the function selection line.

14. A method of testing a System on a Chip (SoC), the method comprising:
    closing an isolation analog switch of an analog/digital input/output buffer of the SoC, to couple an analog module to a package pin of the SoC, to test the analog module, in response to determining that the analog/digital input/output buffer is in an analog mode; and
    in response to determining that the analog/digital input/output buffer is in a digital mode:
       opening the isolation analog switch, to isolate the analog module from the package pin;
       enabling an output buffer, to couple a digital circuit to output data to the package pin, to test the digital circuit, in response to determining that a digital output mode is selected; and
       placing the output buffer in a high impedance state, to couple the digital circuit to receive data from the package pin using a digital input buffer, to test the digital circuit, in response to determining that a digital input mode is selected.

15. The method of claim 14, further comprising placing the output buffer in the high impedance state, in response to determining that the analog/digital input/output buffer is in the analog mode.

16. The method of claim 14, further comprising:
    enabling the output buffer, in response to determining that a control signal indicates that the digital output mode is selected; and
    entering the high impedance state, in response to determining that the control signal indicates that either the digital input mode is selected or that the analog/digital input/output buffer is in the analog mode.

17. The method of claim 14, further comprising coupling the packaging pin to automated test equipment.

* * * * *